(12) United States Patent
Cheng et al.

(10) Patent No.: US 10,720,364 B2
(45) Date of Patent: Jul. 21, 2020

(54) FORMING VERTICAL TRANSISTOR DEVICES WITH GREATER LAYOUT FLEXIBILITY AND PACKING DENSITY

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/105,690

(22) Filed: Aug. 20, 2018

(65) Prior Publication Data
US 2020/0058565 A1 Feb. 20, 2020

(51) Int. Cl.
*H01L 21/324* (2006.01)
*H01L 21/8238* (2006.01)
*H01L 21/225* (2006.01)
*H01L 21/306* (2006.01)
*H01L 29/78* (2006.01)
*H01L 29/66* (2006.01)
*H01L 23/535* (2006.01)
*H01L 27/092* (2006.01)
(Continued)

(52) U.S. Cl.
CPC .. *H01L 21/823885* (2013.01); *H01L 21/2251* (2013.01); *H01L 21/30604* (2013.01); *H01L 21/324* (2013.01); *H01L 21/823814* (2013.01); *H01L 21/823871* (2013.01); *H01L 21/823878* (2013.01); *H01L 23/535* (2013.01); *H01L 27/092* (2013.01); *H01L 29/0653* (2013.01); *H01L 29/0847* (2013.01); *H01L 29/66553* (2013.01); *H01L 29/66666* (2013.01); *H01L 29/7827* (2013.01)

(58) Field of Classification Search
None
See application file for complete search history.

(56) References Cited

U.S. PATENT DOCUMENTS 7,670,934 B1* 3/2010 Pal ............... H01L 21/823412
257/E21.09
8,039,893 B2 10/2011 Masuoka et al.
(Continued)

*Primary Examiner* — Bilkis Jahan
(74) *Attorney, Agent, or Firm* — Tutunjian & Bitetto, P.C.; Vazken Alexanian

(57) ABSTRACT

A method of forming a fin field effect transistor circuit is provided. The method includes forming a plurality of vertical fins on a substrate, and forming a protective liner having a varying thickness on the substrate and plurality of vertical fins. The method further includes removing thinner portions of the protective liner from the substrate to form protective liner segments on the plurality of vertical fins. The method further includes removing portions of the substrate exposed by removing the thinner portions of the protective liner to form trenches adjacent to at least one pair of vertical fins and two substrate mesas. The method further includes laterally etching the substrate mesa to widen the trench, reduce the width of the substrate mesa to form a supporting pillar, and undercut the at least one pair of vertical fins, and forming a first bottom source/drain layer in the widened trench.

9 Claims, 8 Drawing Sheets

(51) Int. Cl.
    *H01L 29/08*    (2006.01)
    *H01L 29/06*    (2006.01)

(56) References Cited

U.S. PATENT DOCUMENTS

| | | |
|---|---|---|
| 9,299,835 B1 | 3/2016 | Anderson et al. |
| 9,680,473 B1 | 6/2017 | Anderson et al. |
| 9,761,728 B1 | 9/2017 | Cheng et al. |
| 9,876,015 B1 | 1/2018 | Balakrishnan et al. |
| 2006/0261406 A1 | 11/2006 | Chen |
| 2012/0223364 A1* | 9/2012 | Chung ............ H01L 21/823807 257/192 |
| 2013/0164891 A1 | 6/2013 | Bryant et al. |
| 2015/0014776 A1* | 1/2015 | Akarvardar ..... H01L 21/823431 257/368 |
| 2016/0043074 A1 | 2/2016 | Hurley et al. |
| 2017/0025412 A1 | 1/2017 | Jun et al. |
| 2018/0005895 A1 | 1/2018 | Cheng et al. |
| 2019/0214484 A1* | 7/2019 | Niimi ............. H01L 21/823807 |

\* cited by examiner

US 10,720,364 B2

FORMING VERTICAL TRANSISTOR DEVICES WITH GREATER LAYOUT FLEXIBILITY AND PACKING DENSITY

BACKGROUND

Technical Field

The present invention generally relates to vertical transport fin field effect transistor (VT FinFET) devices, and more particularly to digital logic devices utilizing vertical transport fin field effect transistor devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming a fin field effect transistor circuit is provided. The method includes forming a plurality of vertical fins on a substrate, and forming a protective liner having a varying thickness on the substrate and plurality of vertical fins. The method further includes removing thinner portions of the protective liner from the substrate to form protective liner segments on the plurality of vertical fins. The method further includes removing portions of the substrate exposed by removing the thinner portions of the protective liner to form trenches adjacent to at least one pair of vertical fins and two substrate mesas. The method further includes laterally etching the substrate mesa to widen the trench, reduce the width of the substrate mesa to form a supporting pillar, and undercut the at least one pair of vertical fins, and forming a first bottom source/drain layer in the widened trench.

In accordance with another embodiment of the present invention, a method of forming a fin field effect transistor circuit is provided. The method includes forming at least four vertical fins on a substrate. The method further includes forming a protective liner having a varying thickness on the substrate and the at least four vertical fins. The method further includes removing thinner portions of the protective liner between one pair of the at least four vertical fins from the substrate to form protective liner segments on the at least four vertical fins. The method further includes removing portions of the substrate exposed by removing the thinner portions of the protective liner to form a first trench between the one pair of the at least four vertical fins and a substrate mesa on opposite sides of the first trench, and an additional trench on each side of the substrate mesas opposite the first trench, wherein a first substrate mesa is below a first adjacent set of vertical fins and a second substrate mesa is below a second set of vertical fins. The method further includes laterally etching the substrate mesas to widen the first trench and the two additional trenches, reduce the width of the substrate mesas to form supporting pillars, and undercut the at least one pair of vertical fins, and forming a first bottom source/drain layer in the widened first trench and the two additional trenches.

In accordance with yet another embodiment of the present invention, a fin field effect transistor circuit is provided. The fin field effect transistor circuit includes a first vertical fin on a p-type bottom source/drain layer, and a second vertical fin on an n-type bottom source/drain layer, wherein the p-type bottom source/drain layer and n-type bottom source/drain layer form a p-n junction. The circuit further includes a bottom spacer layer on the p-type bottom source/drain layer and n-type bottom source/drain layer. The circuit further includes a gate structure on the first vertical fin and second vertical fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention can provide greater packing density of vertical fin field effect transistor (FinFET) devices on a substrate by forming closely spaced pairs of vertical fins on a substrate. Neighboring vertical fins forming separate FinFETs can share a bottom source/drain to reduce the distance necessary between the devices.

Embodiments of the present invention provide a method of forming pairs of spaced vertical fins on a narrower supporting pillar that reduces the space for bottom source/drains and electrically couples adjoining transistor devices to form logic gate devices.

Embodiments of the present invention provide a NAND device or a NOR device having a reduced footprint on a substrate by having a shared bottom source/drain between adjacent n-type or p-type devices, and a shared gate structures between an n-type device adjacent to a p-type device.

Exemplary applications/uses to which the present invention can be applied include, but are not limited to: inverters, digital logic gates, for example, AND gates, OR gates, NAND gates, NOR gates, EXOR (exclusive-OR) gates, EXNOR (exclusive-NOR) gates, Flip-Flops, and multiplexors.

It is to be understood that aspects of the present invention will be described in terms of a given illustrative architecture; however, other architectures, structures, substrate materials and process features and steps can be varied within the scope of aspects of the present invention.

Figure 1:
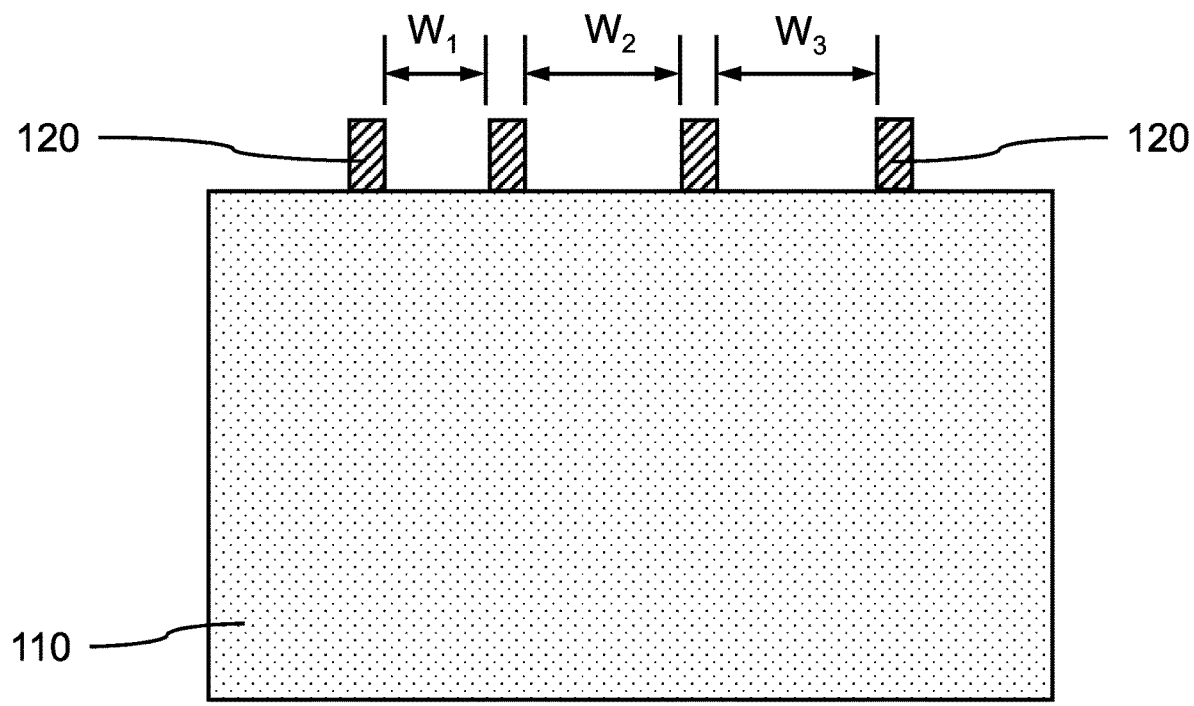
FIG. 1 is a cross-sectional side view showing a plurality of fin templates on a substrate with different distances between each pair of adjacent fin templates, in accordance with an embodiment of the present invention.

Referring now to the drawings in which like numerals represent the same or similar elements and initially to FIG. 1, a cross-sectional side view of a plurality of fin templates on a substrate with different distances between each pair of adjacent fin templates is shown, in accordance with an embodiment of the present invention.

In one or more embodiments, a plurality of fin templates 120 can be formed on a substrate 110, where the fin templates 120 can be formed by a forming and patterning a lithographic hardmask. The fin templates 120 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The fin templates 120 can be separated by distances, $W_1$, $W_2$, and $W_3$, where $W_1 \neq W_2 \neq W_3$, or $W_1 = W_3$, and $W_1 \neq W_2$, $W_3 \neq W_2$. In various embodiments, the distances, $W_1$ and $W_3$, can be less than $W_2$, and $W_3$ can be the same as $W_1$ (i.e., $W_1 < W_2$, $W_3 < W_2$, $W_1 = W_3$).

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)) or a II-VI semiconductor (e.g., cadmium selenide (CdSe)).

Figure 2:
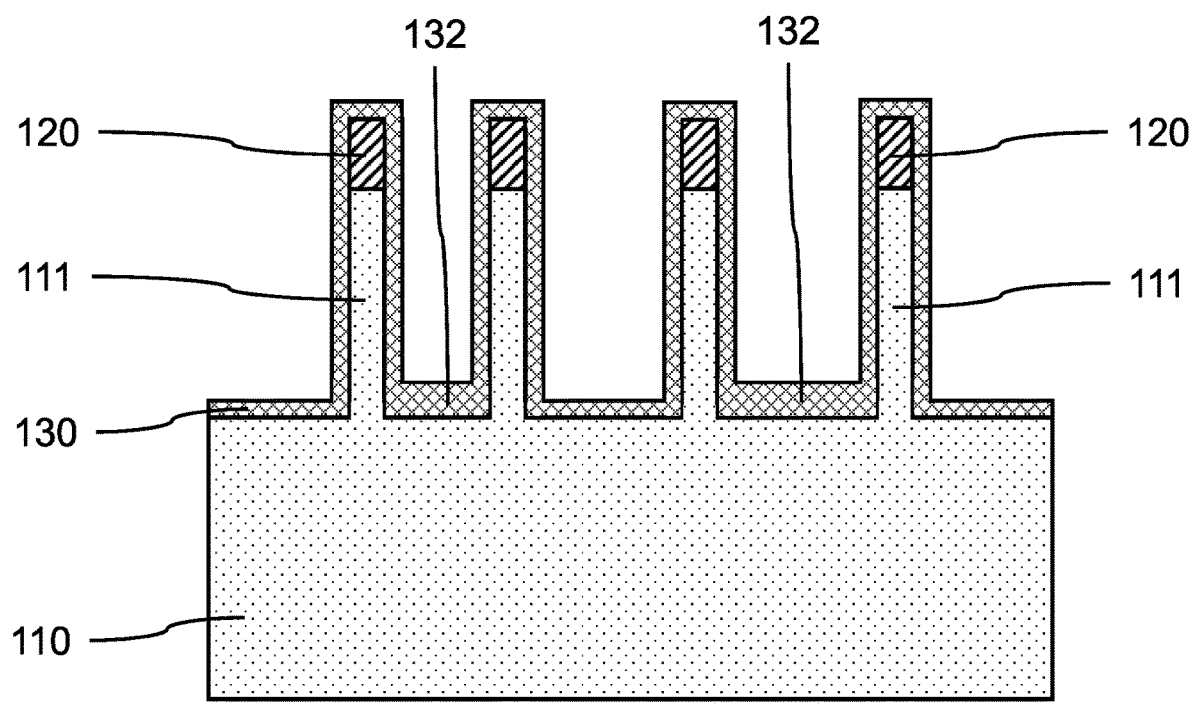
FIG. 2 is a cross-sectional side view showing a plurality of vertical fins on a substrate, and a protective liner having a varying thickness on the substrate and vertical fins, in accordance with an embodiment of the present invention.

FIG. 2 is a cross-sectional side view showing a plurality of vertical fins on a substrate, and a protective liner having a varying thickness on the substrate and vertical fins, in accordance with an embodiment of the present invention.

In one or more embodiments, one or more vertical fins 111 can be formed on the substrate 110. The vertical fins 111 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 111 may be formed by a direct write process or double patterning process using, for example, immersion lithography, extreme ultraviolet lithography, or x-ray lithography. The fin templates 120 can be formed on each of the vertical fins as part of the patterning process, where the width of a mandrel formed during the sidewall image transfer (SIT) process can determine the distances, $W_1$ and $W_3$, with $W_1 = W_3$, and $W_2$ being determined by the pitch between the mandrels and width of the fin templates 120, with $W_1 \neq W_2$, $W_3 \neq W_2$. The fin templates 120 can also be formed on each of the vertical fins as part of a direct-write process using, for example, x-ray lithography, where the fin templates 120 can be independently spaced, so $W_1 \neq W_2 \neq W_3$. Distances, $W_1$, $W_2$, and $W_3$, between the vertical fins can depend on the final arrangement of devices on the substrate.

In various embodiments, the distance, $W_1$, can be in the range of about 15 nm to about 40 nm, or about 20 nm to about 30 nm, although other distances are also contemplated.

In various embodiments, the distance, $W_2$, can be in the range of about 30 nm to about 60 nm, or about 40 nm to about 50 nm, although other distances are also contemplated.

In various embodiments, the distance, $W_3$, can be in the range of about 15 nm to about 40 nm, or about 20 nm to about 30 nm, although other distances are also contemplated.

In one or more embodiments, a protective liner 130 can be formed on the substrate 110 and vertical fins 111, where the protective liner 130 can have a varying thickness due to the formation process and variable vertical fin spacing. In various embodiments, the protective liner 130 can be formed by a conformal deposition, for example, atomic layer deposition (ALD) or plasma enhanced ALD (PEALD), or by other suitable deposition techniques, for example, chemical vapor deposition (CVD), or plasma enhanced CVD (PECVD). The different widths between the vertical fins can provide for pinching off the lower portion of the spaces between the vertical fins as the thickness of the protective liner 130 builds up. Although the vertical fins 111 are depicted in the figures as having straight sidewalls down to the substrate, the vertical fins can have a tapered shape. The spaces near the bottom of the vertical fins 111 can be narrower and rounded due to flaring of the base of the fins.

In various embodiments, the thinner regions of the protective liner 130 can have a thickness in a range of about 2 nm to about 8 nm, or about 3 nm to about 6 nm, whereas the thicker regions 132 can have a thickness that is greater than the thickness of the protective liner 130 by an amount in a range of about 2 nm to about 10 nm, or about 3 nm to about 5 nm.

In various embodiments, the protective liner 130 can be a dielectric material, including, but not limited to, silicon oxide ($SiO_x$), silicon nitride ($Si_xN_y$), silicon oxynitride ($Si_xO_yN_z$), silicon carbonitride ($Si_xC_yN_z$), silicon boronitride ($Si_xB_yN_z$), silicon borocarbide ($Si_xB_yC_z$), silicon boro carbonitride ($Si_wB_xC_yN_z$), or combinations thereof. In a non-limiting exemplary embodiment, the protective liner 130 can be stoichiometric silicon nitride ($Si_3N_4$).

Figure 3:
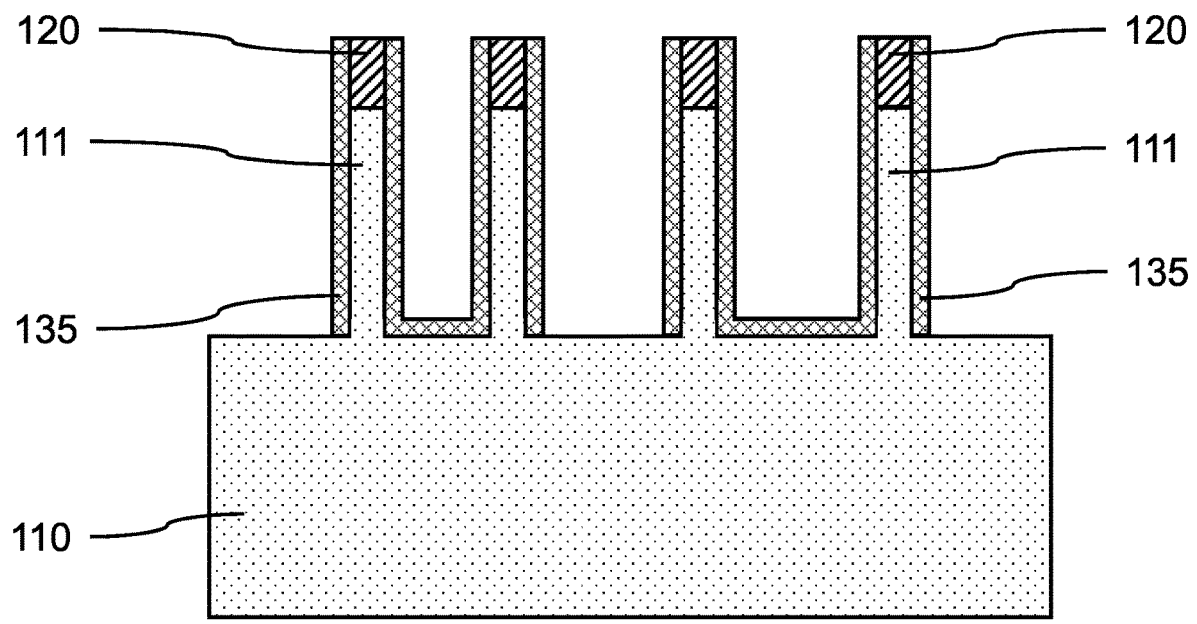
FIG. 3 is a cross-sectional side view showing thinner sections of the portion protective liner removed from the substrate, in accordance with an embodiment of the present invention.

FIG. 3 is a cross-sectional side view showing thinner sections of the portion protective liner removed from the substrate, in accordance with an embodiment of the present invention.

In one or more embodiments, a selective, directional etch, for example, a reactive ion etch (RIE), can be used to remove portions of the protective liner 130 that are essentially perpendicular to the direction of the ion beam. The thinner sections of the protective liner 130 can be completely removed, whereas the thickness of the thicker sections of the protective liner 130 can be reduced by about the same amount. The directional nature of the RIE also can leave portions of the protective liner 130 on the sidewalls and end walls of the vertical fins 111. The portions of the protective liner 130 on the fin templates 120 can also be removed by the directional etch. In various embodiments, removal of portions of the protective liner 130 can expose sections of the substrate between particular pairs of vertical fins 111, and the top surfaces of the fin templates 120, and form protective liner segments 135. Portions of the protective liner segments 135 can be between other pairs of vertical fins separated by a distance less than the distances covered by the thinner sections of the protective liner 130.

In various embodiments, where $W_1<W_2$ and $W_3<W_2$, the protective liner 130 between vertical fins separated by distance, $W_2$, can have the least thickness, and vertical fins 111 separated by the least distance of $W_1$ or $W_3$ can have the greatest thickness. Where $W_1=W_3$, the protective liner 130 can have the same thicknesses between the vertical fins 111 separated by $W_1$ and $W_3$, which can be greater than the thickness of the protective liner 130 between vertical fins separated by a distance, $W_2$. Spacing of paired fins can be smaller than the spacing between adjacent fin pairs.

Figure 4:
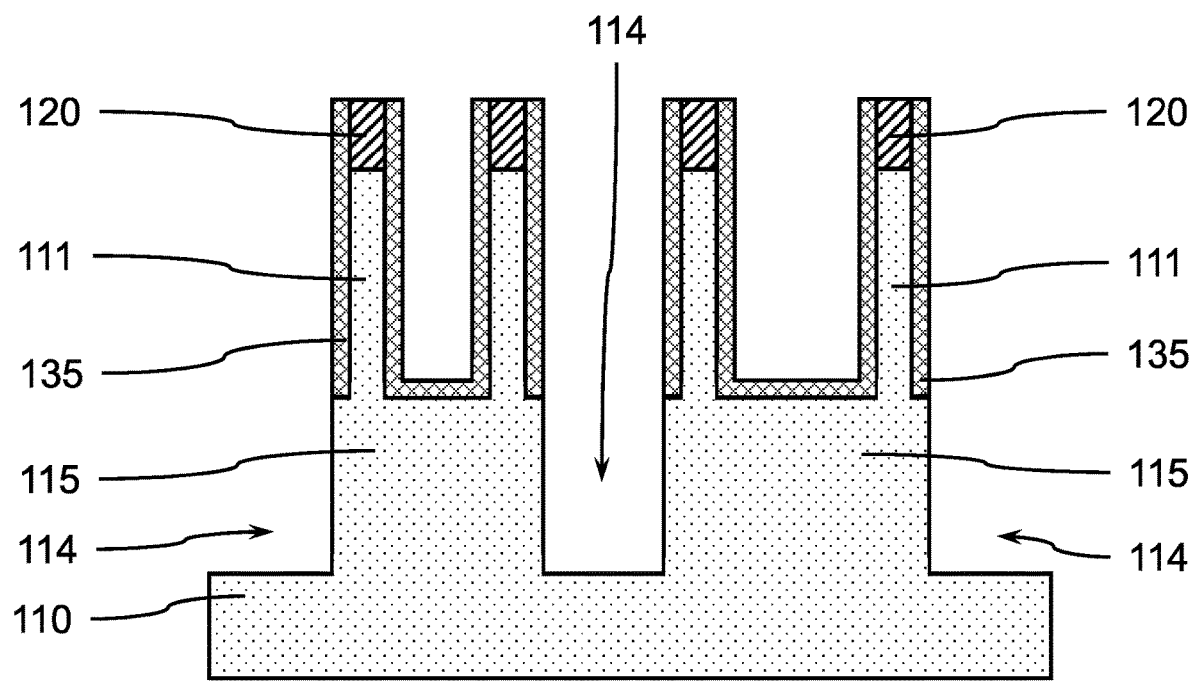
FIG. 4 is a cross-sectional side view showing an exposed portion of the substrate removed to form trenches between vertical fins covered by the protective liner, in accordance with an embodiment of the present invention.

FIG. 4 is a cross-sectional side view showing an exposed portion of the substrate removed to form trenches between vertical fins covered by the protective liner, in accordance with an embodiment of the present invention.

In one or more embodiments, portions of the substrate 110 exposed by removal of portions of the protective liner 130 can be removed using a directional etch (e.g., RIE). In one or more embodiments, trenches 114 can be formed by removing portions of the substrate between pairs of vertical fins 111, where the substrate mesas 115 can remain under pairs of fins still covered by the protective liner segments 135.

In various embodiments, the substrate 110 can be removed to a depth in a range of about 20 nm to about 60 nm, or about 30 nm to about 40 nm, although other depths are also contemplated.

Figure 5:
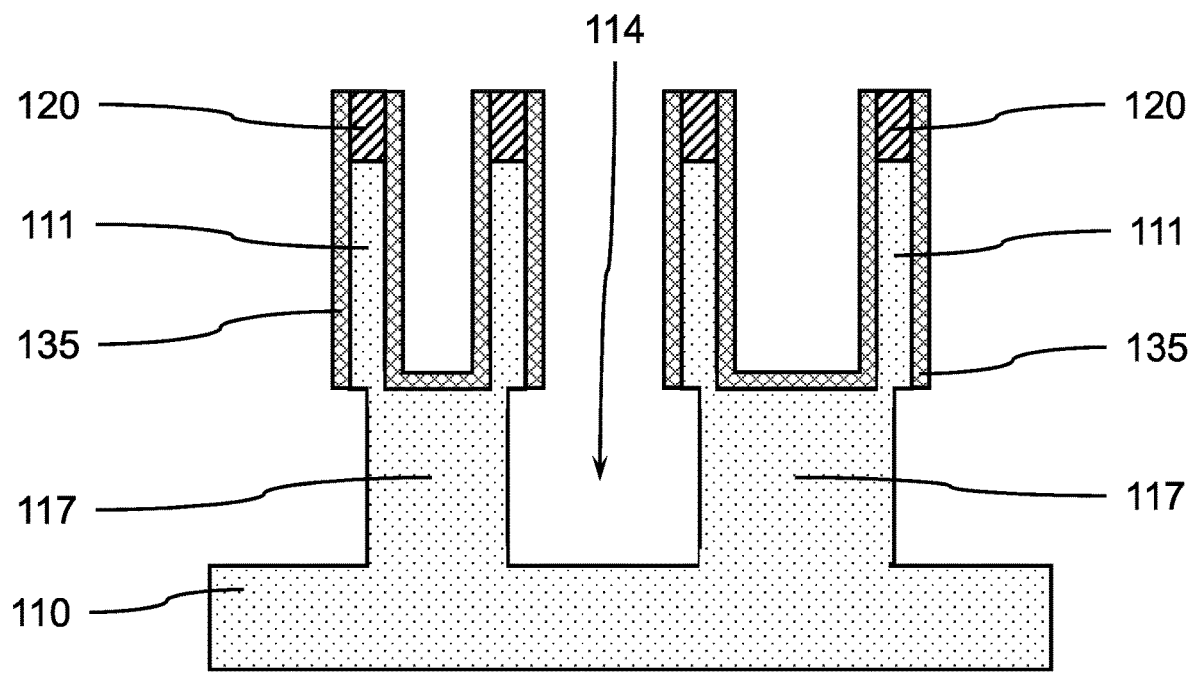
FIG. 5 is a cross-sectional side view showing portions of the substrate below the vertical fins removed by a lateral etch to form a supporting pillar, in accordance with an embodiment of the present invention.

FIG. 5 is a cross-sectional side view showing portions of the substrate below the vertical fins removed by a lateral etch to form a supporting pillar, in accordance with an embodiment of the present invention.

In one or more embodiments, a portion of each of the substrate mesas 115 can be removed, where the portion of each of the substrate mesas 115 can be removed using a lateral etch, (e.g., wet chemical etch, dry plasma etch). The portions of each of the substrate mesas 115 can be removed to undercut the vertical fins 111 to widen trenches 114 and reduce the widths of the substrate mesas 115 to form supporting pillars 117, where the corners of the undercut can be rounded, for example, by using a lateral etch. In various embodiments, the vertical fins 111 can be only partially undercut, such that a bottom of a vertical fin adjoins the underlying supporting pillar 117. The depth of the trenches 114 can be increased by approximately the same distance as the lateral etch.

Figure 6:
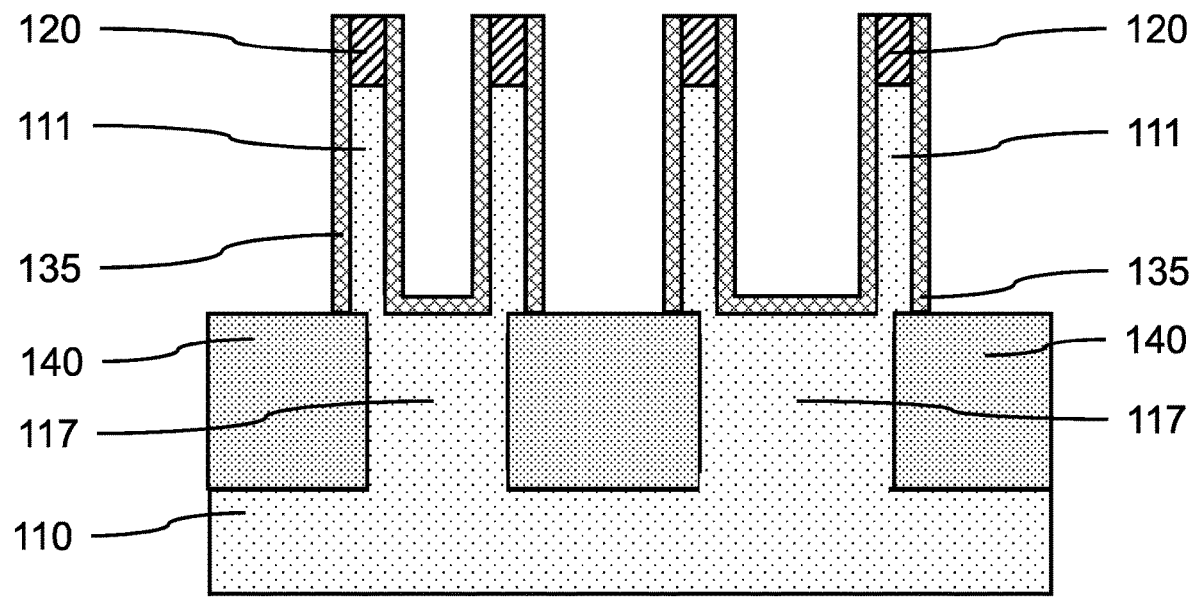
FIG. 6 is a cross-sectional side view showing a first bottom source/drain layer formed on the recessed substrate adjacent to the supporting pillars, in accordance with an embodiment of the present invention.

FIG. 6 is a cross-sectional side view showing a first bottom source/drain layer formed on the recessed substrate adjacent to the supporting pillars, in accordance with an embodiment of the present invention.

In one or more embodiments, a first bottom source/drain layer 140 can be formed on the recessed substrate 110 adjacent to the supporting pillars 117. The bottom source/drain layer 140 can be formed by epitaxial or heteroepitaxial growth on a crystalline surface of the substrate 110 and/or supporting pillars 117, where the faster growth plane of the exposed surfaces can dominate the epitaxial growth process.

In one or more embodiments, the first bottom source/drain layer 140 can be formed to a thickness that fills in the widened trenches 114, where a portion of the first bottom source/drain layer 140 is below and adjoining the vertical fins 111. In various embodiments, the first bottom source/drain layer 140 can have the same thickness as the depth of the widened trenches 114.

In various embodiments, the first bottom source/drain layer 140 can be a semiconductor material (e.g., Si, SiC, SiGe, Ge, etc.) having the same crystal structure and orientation as the underlying substrate 110. The first bottom source/drain layer 140 can be suitably doped to form an n-type or p-type bottom source/drain. In various embodiments, the first bottom source/drain layer 140 can be a semiconductor material, including, but not limited to n-type (e.g., P or As) doped silicon (Si) or p-type (e.g., B) doped silicon-germanium (SiGe).

Figure 7:
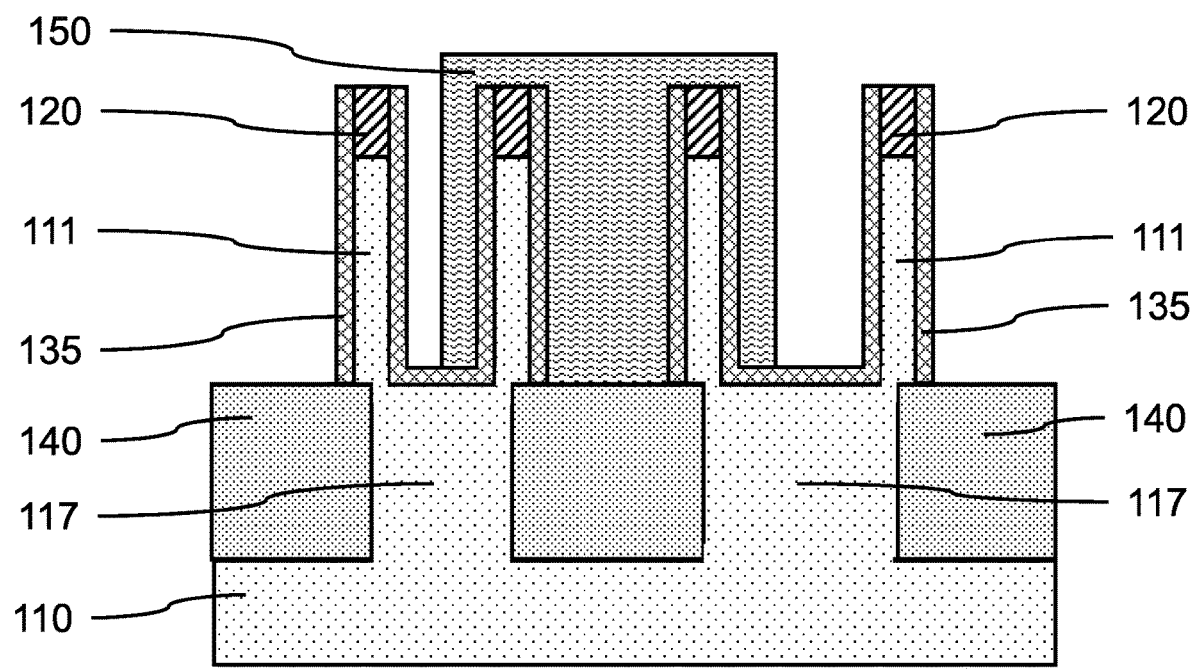
FIG. 7 is a cross-sectional side view showing a masking block on two vertical fins and a portion of the first bottom source/drain layer between a pair of supporting pillars, in accordance with an embodiment of the present invention.

FIG. 7 is a cross-sectional side view showing a masking block on two vertical fins and a portion of the first bottom source/drain layer between a pair of supporting pillars, in accordance with an embodiment of the present invention.

In one or more embodiments, a masking block 150 can be formed on two vertical fins 111 and a portion of the first bottom source/drain layer 140 between a pair of supporting pillars 117. The masking block 150 can be formed by a blanket deposition of a masking layer, for example, by CVD or spin-on, where a masking layer can be deposited on the vertical fins 111, protective liner segments 135, and first bottom source/drain layer 140. The masking layer can be patterned using lithographic techniques and etched to form masking blocks 150. The masking blocks 150 can cover portions of the first bottom source/drain layer 140 between pairs of supporting pillars 117.

In various embodiments, the masking block 150 can be a dielectric material, including, but not limited to, silicon oxide (SiO) or a low-k material. A low-k dielectric can include, but not be limited to, carbon doped silicon oxide (SiO:C), fluorine doped silicon oxide (SiO:F), polymeric material, for example, tetraethyl orthosilicate (TEOS), hydrogen silsesquioxane (HSQ) and methylsilsesquioxane (MSQ), and combinations thereof.

Figure 8:
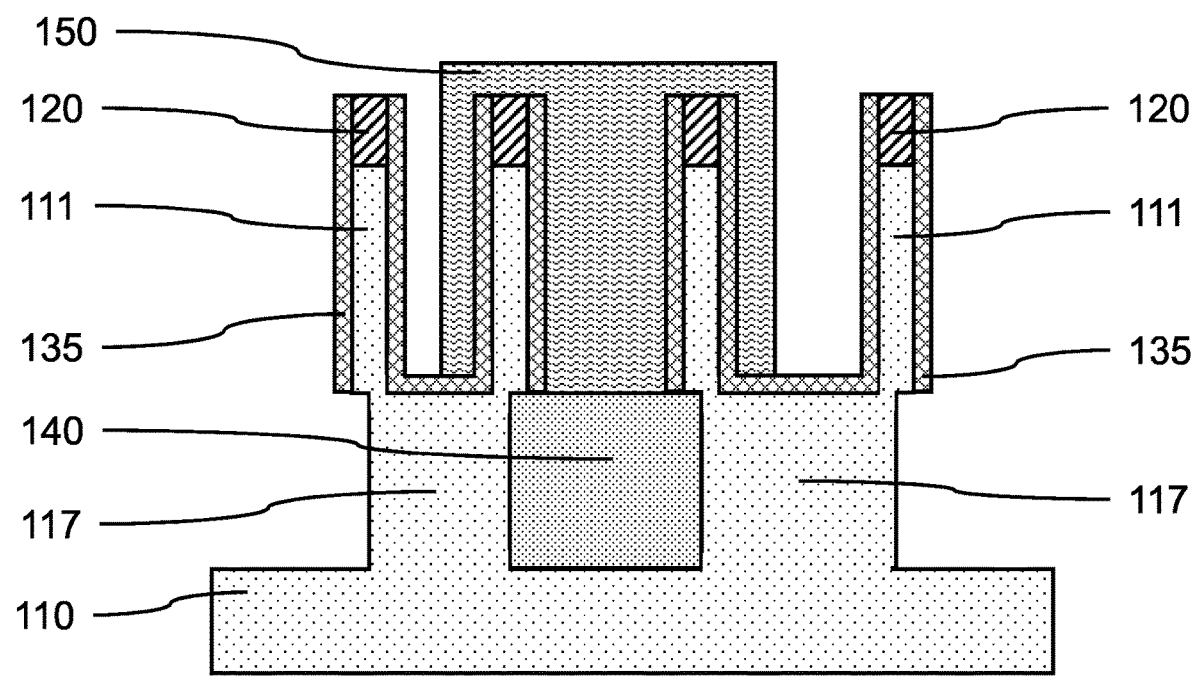
FIG. 8 is a cross-sectional side view showing exposed portions of the first bottom source/drain layer removed, in accordance with an embodiment of the present invention.

FIG. 8 is a cross-sectional side view showing exposed portions of the first bottom source/drain layer removed, in accordance with an embodiment of the present invention.

In one or more embodiments, portions of the first bottom source/drain layer 140 exposed by patterning the masking layer can be removed using a selective etch (e.g., wet chemical etch) to expose the adjoining surfaces of the substrate 110 and supporting pillars 117, while a portion of the first bottom source/drain layer 140 remains under the masking block 150.

Figure 9:
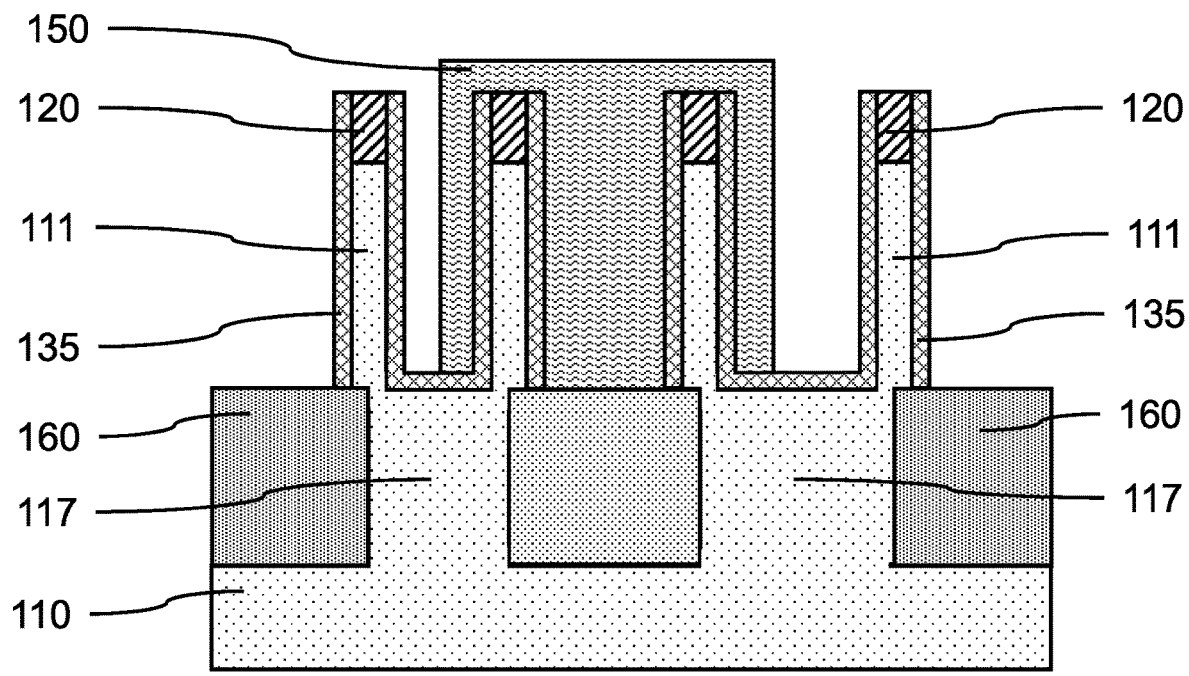
FIG. 9 is a cross-sectional side view showing a second bottom source/drain layer formed on the recessed substrate exposed by removing the portions of the first bottom source/drain layer, in accordance with an embodiment of the present invention.

FIG. 9 is a cross-sectional side view showing a second bottom source/drain layer formed on the recessed substrate exposed by removing the portions of the first bottom source/drain layer, in accordance with an embodiment of the present invention.

In one or more embodiments, a second bottom source/drain layer 160 can be formed on the recessed substrate 110 exposed by removing the portions of the first bottom source/drain layer 140. The second bottom source/drain layer 160 can be formed by epitaxial or heteroepitaxial growth on a crystalline surface of the substrate 110 and/or supporting pillars 117, where the faster growth plane of the exposed surfaces can dominate the epitaxial growth process.

In various embodiments, the second bottom source/drain layer 160 can be a semiconductor material (e.g., Si, SiC, SiGe, Ge, etc.) having the same crystal structure and orientation as the underlying substrate 110. The second bottom source/drain layer 160 can be suitably doped to form an n-type or p-type bottom source/drain. In various embodiments, the second bottom source/drain layer 160 can be a semiconductor material, including, but not limited to n-type (e.g., P or As) doped silicon (Si) or p-type (e.g., B) doped silicon-germanium (SiGe). The second bottom source/drain layer 160 can have a dopant type opposite the dopant type of the first bottom source/drain layer 140, where the different doping types can form complementary devices. The bottom source/drain layer for an n-type FET can be a different material and dopant from the bottom source/drain layer for the p-type FET, where, for example, the supporting pillars 117 can be silicon and the bottom source/drain layer 140 can be silicon-germanium (SiGe).

Figure 10:
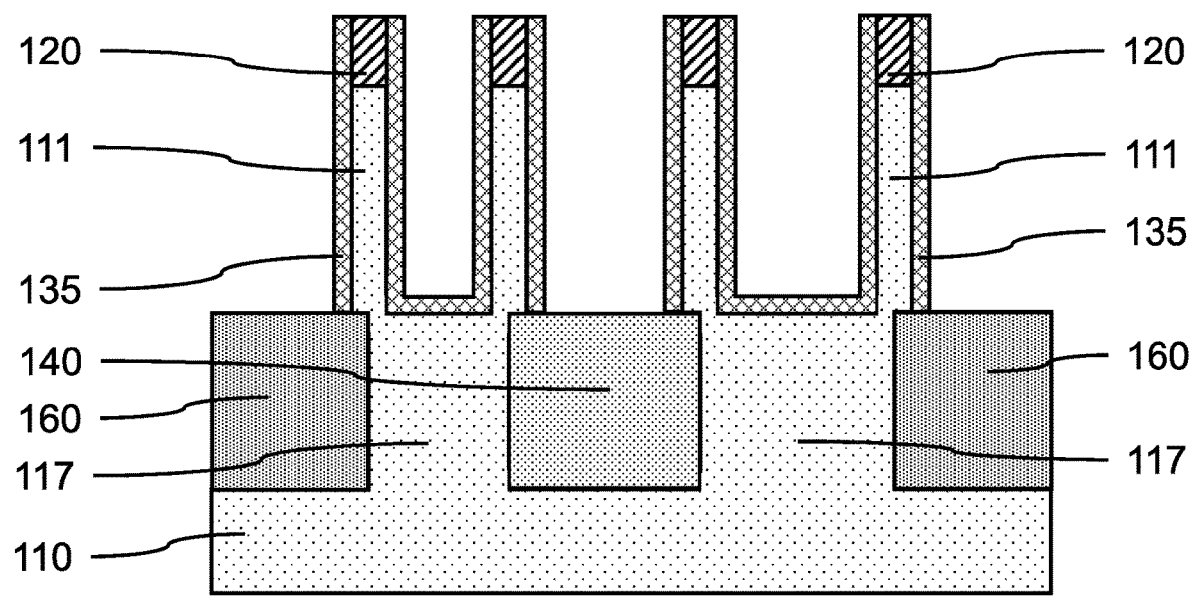
FIG. 10 is a cross-sectional side view showing the masking block removed from the two vertical fins and first bottom source/drain layer, in accordance with an embodiment of the present invention.

FIG. 10 is a cross-sectional side view showing the masking block removed from the two vertical fins and first bottom source/drain layer, in accordance with an embodiment of the present invention.

In one or more embodiments, the masking block 150 can be removed from the two vertical fins and first bottom source/drain layer 140 using a selective, isotropic etch to get under the overhanging vertical fins 111 and protective liner segments 135.

Figure 11:
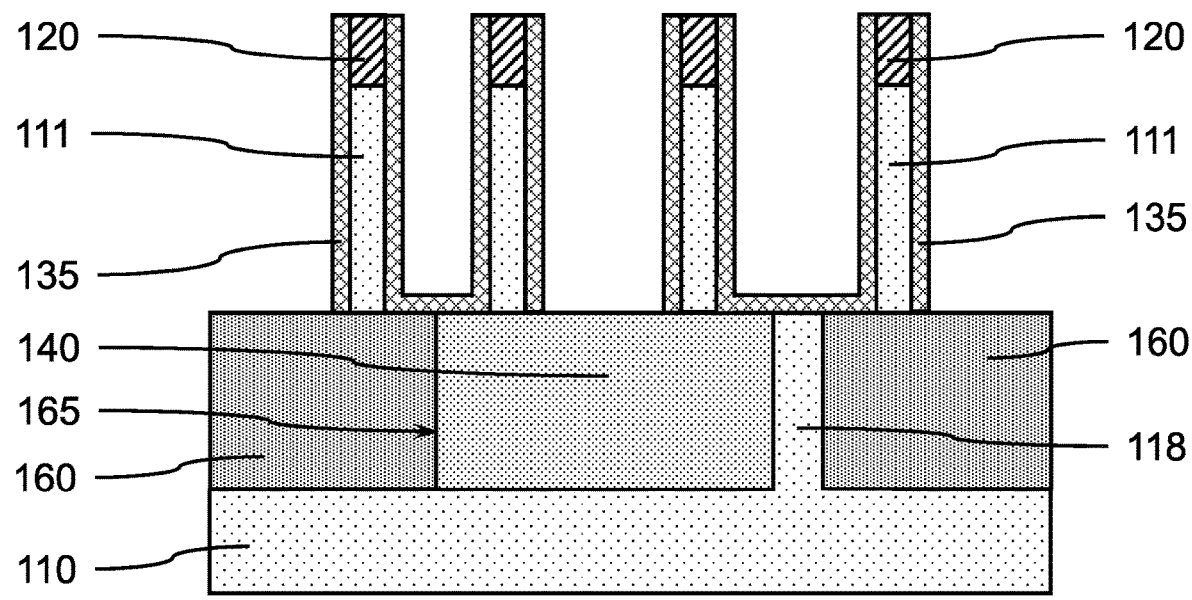
FIG. 11 is a cross-sectional side view showing the first bottom source/drain layer and second bottom source/drain layer diffused into the adjacent supporting pillars, in accordance with an embodiment of the present invention.

FIG. 11 is a cross-sectional side view showing the first bottom source/drain layer and second bottom source/drain layer diffused into the adjacent supporting pillars, in accordance with an embodiment of the present invention.

In one or more embodiments, dopants from the first bottom source/drain layer 140 and second bottom source/drain layer 160 can be diffused into the adjacent supporting pillars 117 using a heat treatment. The dopants can diffuse laterally into the adjacent supporting pillars 117, such that the oppositely doped first bottom source/drain layer 140 and second bottom source/drain layer 160 can form a p-n junction 165 underneath the vertical fins 111 on the doped supporting pillars 117. In various embodiments, some of the supporting pillars 117 are wider than other supporting pillars 117, where the different widths can depend on $W_1$ and $W_3$. The extend of diffusion of dopants into the wider supporting pillars 117 can be less than the extend of diffusion that can form the p-n junctions 165 in the narrower supporting pillars 117, which can leave separation sections 118 between the oppositely doped portions of supporting pillars 117.

Figure 12:
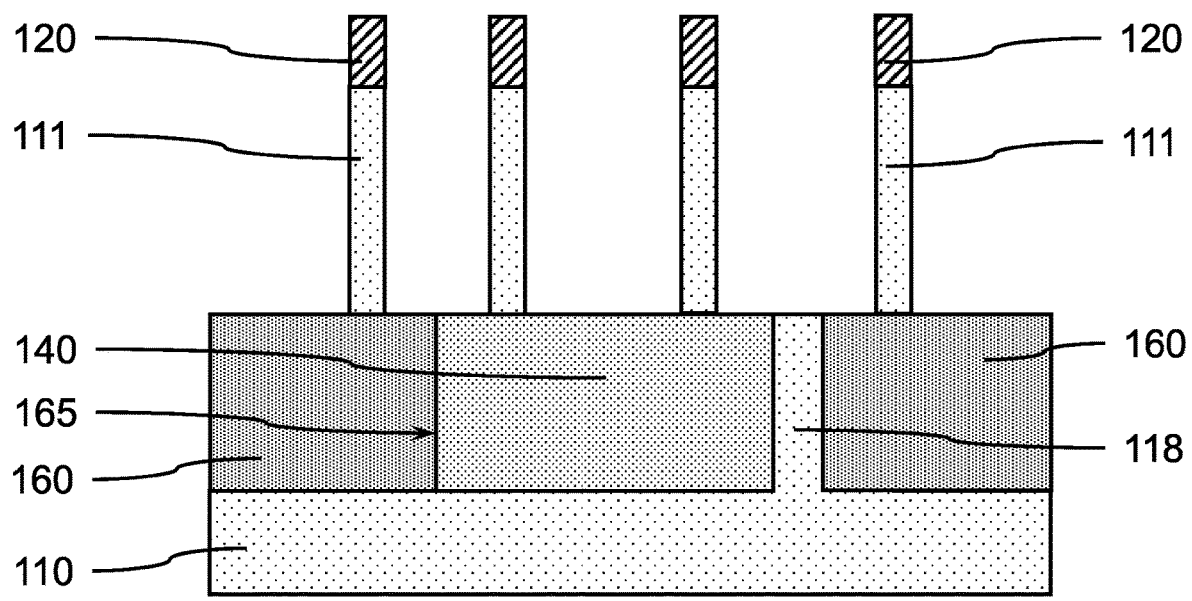
FIG. 12 is a cross-sectional side view showing the vertical fins exposed after removing the remaining protective liner, in accordance with an embodiment of the present invention.

FIG. 12 is a cross-sectional side view showing the vertical fins exposed after removing the remaining protective liner, in accordance with an embodiment of the present invention.

In one or more embodiments, the remaining portions of the protective liner segments 135 can be removed using a selective, isotropic etch to expose the sidewalls and end walls of the vertical fins 111, the fin templates 120, and portions of the first bottom source/drain layer 140 and second bottom source/drain layer 160 that can include the p-n junction 165 underneath the vertical fins 111.

Figure 13:
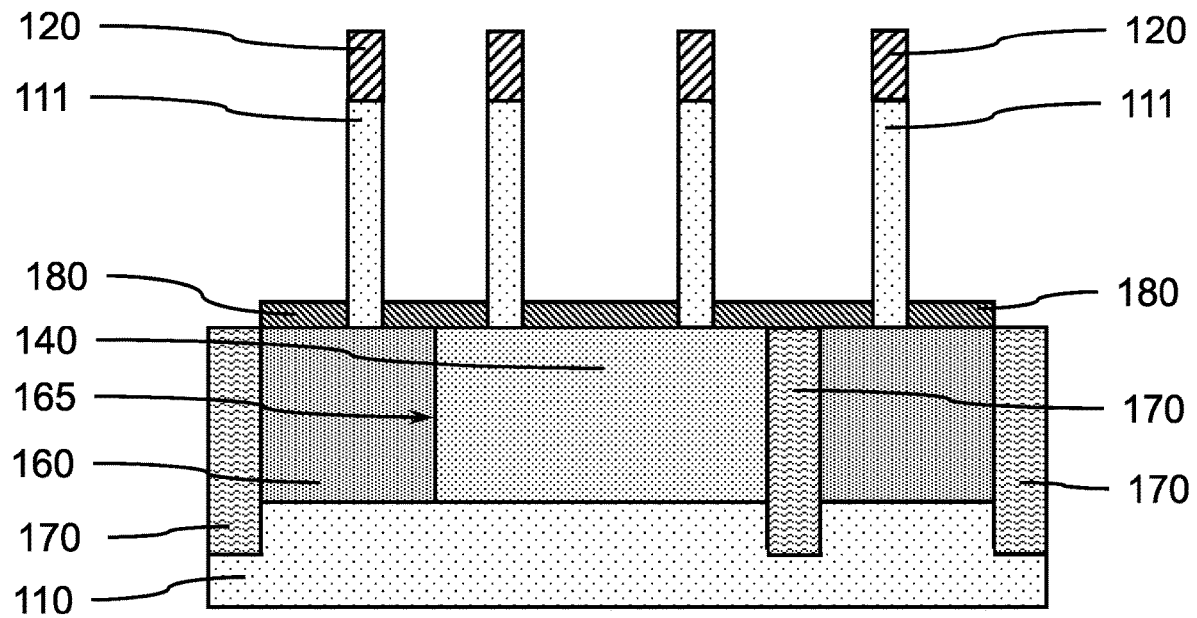
FIG. 13 is a cross-sectional side view showing isolation regions formed in the second bottom source/drain layer, and a bottom spacer on the bottom source/drain layers and vertical fins, in accordance with an embodiment of the present invention.

FIG. 13 is a cross-sectional side view showing isolation regions formed in the second bottom source/drain layer, and a bottom spacer on the bottom source/drain layers and vertical fins, in accordance with an embodiment of the present invention.

In one or more embodiments, isolation regions 170 can be formed in the second bottom source/drain layer 160, and by replacing the separation sections 118 between the oppositely doped portions of supporting pillars 117 with a dielectric material. The vertical fins 111, fin templates 120, and bottom source/drain layers 140, 160 can be masked and patterned to expose portions of the bottom source/drain layers 140, 160 using lithographic techniques. The exposed portion(s) of the bottom source/drain layers 140, 160 and underlying portion(s) of the substrate 110 can be removed to form isolation region trenches. The isolation region trenches can be filled with a dielectric material, including, but not limited to, silicon oxide (SiO), silicon nitride (SiN), or a low-k material to form isolation regions 170. The separation sections 118 between the oppositely doped portions of supporting pillars 117 can also be exposed and removed using a selective etch, and an isolation region 170 can be formed in the formed opening. A narrower isolation region can replace separation section 118, where distance, $W_1=W_3$, to account for fin spacing within paired vertical fins 111.

In one or more embodiments, a bottom spacer layer 180 can be formed on the isolation regions 170, first bottom source/drain layer 140, second bottom source/drain layer 160, and doped portions of supporting pillars 117, where the bottom spacer layer 180 can be formed by a suitable techniques, for example, by a directional deposition such as high density plasma deposition (HDP) which deposits a thicker film on horizontal surfaces than vertical sidewalls. An etch back process (e.g., wet chemical etch) can be performed to remove the deposited film on vertical sidewalls, leaving the HDP film on horizontal surfaces as spacers.

In various embodiments, the bottom spacer layer 180 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

In various embodiments, the bottom spacer layer 180 can have a thickness in a range of about 3 nm to about 10 nm, or about 5 nm to about 7 nm, although other thicknesses are also contemplated. The thickness of the bottom spacer layer 180 can determine the extent that dopants are diffused into the lower portions of the vertical fins 111 proximal to the first bottom source/drain layer 140 and second bottom source/drain layer 160 to form lower extension regions adjacent to a gate structure.

In various embodiments, the gate dielectric layer 190 can have a thickness in a range of about 1 nm to about 3 nm, or about 2 nm, although other thicknesses are also contemplated.

Figure 14:
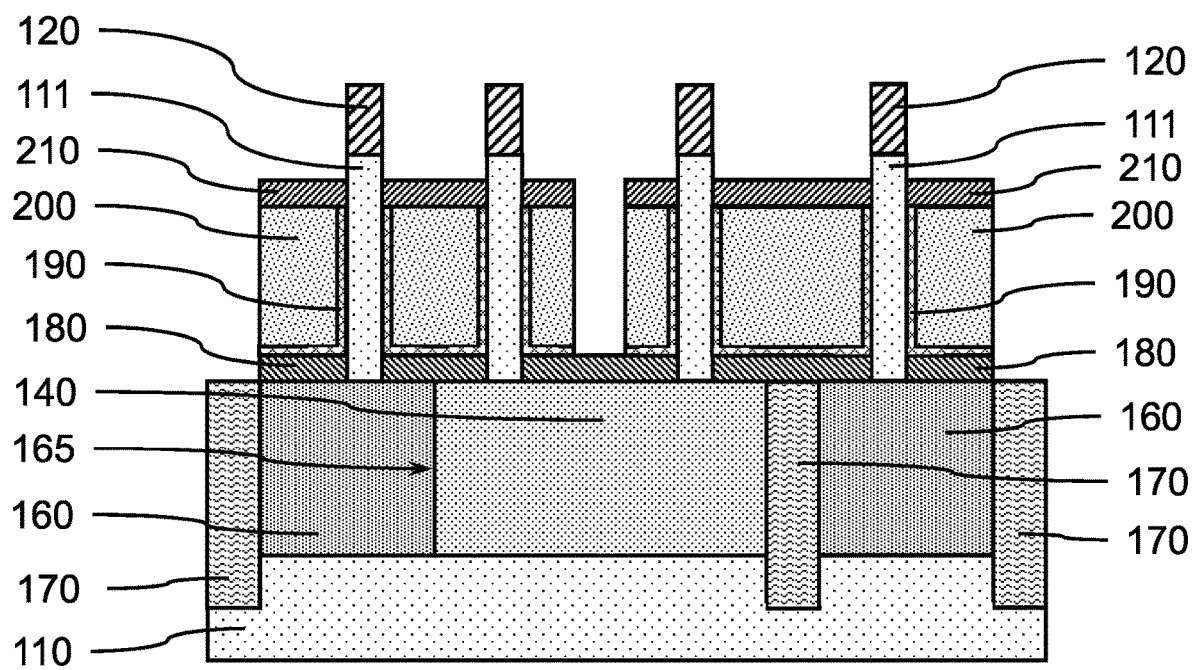
FIG. 14 is a cross-sectional side view showing gate structures on the bottom spacer and vertical fins, in accordance with an embodiment of the present invention.

FIG. 14 is a cross-sectional side view showing gate structures on the bottom spacer and vertical fins, in accordance with an embodiment of the present invention.

In one or more embodiments, gate structures can be formed on the bottom spacer 180 and vertical fins 111, where the gate structures can include gate dielectric layer 190 and a conductive gate fill 200.

In one or more embodiments, a gate dielectric layer 190 can be formed on the bottom spacer 180 and sidewalls and end walls of the vertical fins 111. The gate dielectric layer 190 can be formed by a conformal deposition (e.g., ALD, PEALD), or by other suitable deposition techniques, for example, chemical vapor deposition (CVD), or plasma enhanced CVD (PECVD).

In various embodiments, the gate dielectric layer 190 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In one or more embodiments, a conductive gate fill 200 can be formed on the gate dielectric layer 190, where the conductive gate fill 200 can be formed by a blanket deposition.

In various embodiments, the conductive gate fill 200 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, or any suitable combination of these materials. The conductive gate fill can include a conductive work function layer formed on the gate dielectric layer 190 by a conformal deposition.

In one or more embodiments, a top spacer layer 210 can be formed on the gate dielectric layer 190 and a conductive gate fill 200, where the a top spacer layer 210 can be formed by a directional deposition, for example, high density plasma (HDP) or gas cluster ion beam (GCIB), or a conformal deposition (e.g., CVD, ALD). An etch-back can be used to remove deposited materials.

In various embodiments, the top spacer layer 210 can have a thickness in a range of about 3 nm to about 10 nm, or about 5 nm to about 7 nm, although other thicknesses are also contemplated. The thickness of the top spacer layer 210 can determine the extent that dopants are diffused into the upper portions of the vertical fins 111 to form upper extension regions adjacent to a gate structure. The thickness of the top spacer layer 210 and bottom spacer layer 180 can be the same, so dopants would diffuse the same distances to control the lengths of the upper and lower extension regions. The top spacer layer 210, bottom spacer layer 180, conductive gate fill 200, and gate dielectric layer 190 can be patterned using lithographic techniques to form separate gate structures for different devices.

Figure 15:
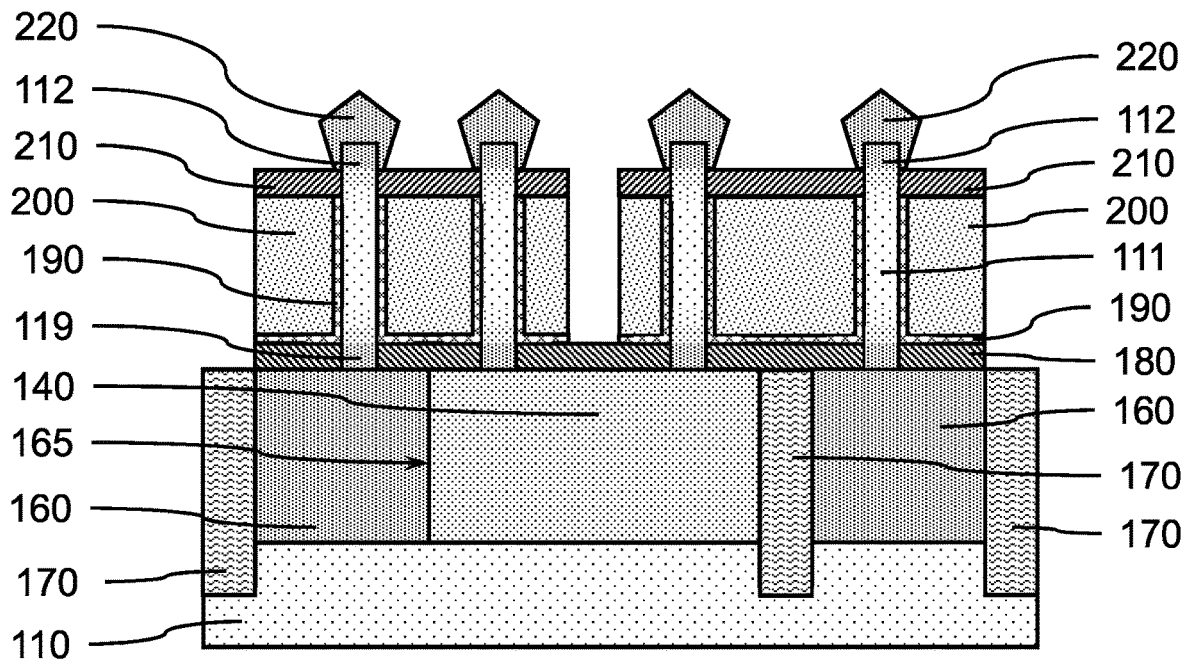
FIG. 15 is a cross-sectional side view showing an interlayer dielectric (ILD) layer on and between the gate structures, in accordance with an embodiment of the present invention.

FIG. 15 is a cross-sectional side view showing top source/drains formed on the vertical fins, in accordance with an embodiment of the present invention.

In one or more embodiments, the fin templates 120 can be removed using a selective etch (e.g., RIE, wet chemical etch) to expose an upper portion of the vertical fins 111. Top source/drains 220 can be formed on the vertical fins 111 exposed above the top spacer layer 210, where the top source/drains 220 can be formed by epitaxial or heteroepitaxial growth. The top source/drains 220 can be suitably doped to form an n-type or p-type bottom source/drain. In various embodiments, the top source/drains 220 can be a semiconductor material, including, but not limited to n-type (e.g., P or As) doped silicon (Si) or p-type (e.g., B) doped silicon-germanium (SiGe). The top source/drains 220 can be doped to match the dopant type of the bottom source/drain underneath the same vertical fin 111.

In one or more embodiments, a heat treatment can be used to diffuse dopants from the top source/drains 220, first bottom source/drain layer 140, and second bottom source/drain layer 160 to the adjoining portions of the vertical fins 111 to form upper extension regions 112 and lower extension regions 119 in the vertical fins 111. The upper and lower extension regions 112, 119 can have a dopant concentration in a range of about $1\times10^{19}/cm^3$ to about $3\times10^{21}/cm^3$, or about $5\times10^{20}/cm^3$ to about $3\times10^{21}/cm^3$, where the extension regions can be about $1\times10^{19}/cm^3$ at the device channel and about $5\times10^{20}/cm^3$ to about $3\times10^{21}/cm^3$ at the interface with the top source/drains 220, first bottom source/drain layer 140, or second bottom source/drain layer 160.

Figure 16:
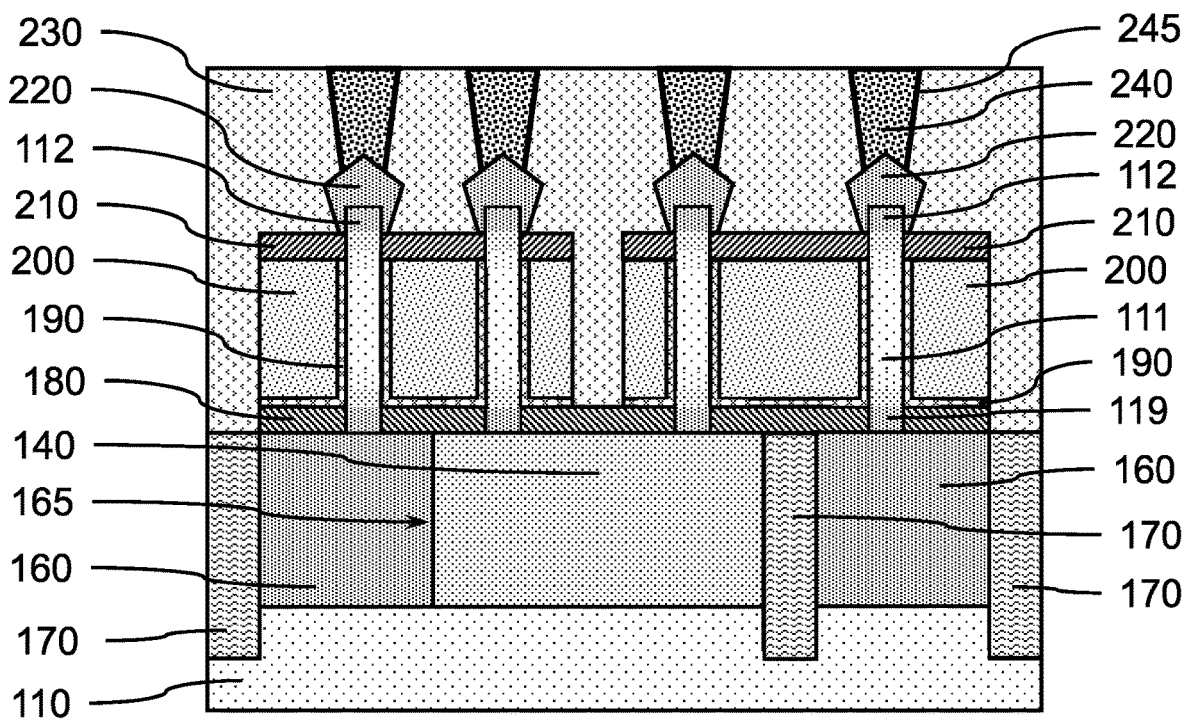
FIG. 16 is a cross-sectional side view showing top source/drains formed on the vertical fins and source/drain contact to the top source/drains, in accordance with an embodiment of the present invention.

FIG. 16 is a cross-sectional side view showing an interlayer dielectric (ILD) layer on and between the gate structures, and source/drain contacts to the top source/drains, in accordance with an embodiment of the present invention.

In one or more embodiments, an interlayer dielectric (ILD) layer 230 can be formed on and between the gate structures, where the ILD layer 230 can be formed by a blanket deposition, for example, CVD or spin-on, and portions of the ILD layer removed using CMP. The ILD layer 230 can be silicon oxide (SiO), a low-k dielectric material, or combinations thereof. The ILD layer 230 can cover the top source/drains 220, top spacer layer 210, and vertical fins 111.

In one or more embodiments, openings can be formed in the ILD layer 230 using lithographic techniques and etching to expose the top source/drains 230. In various embodiments, source/drain contacts 240 can be formed to the top source/drains 220, where the source/drain contacts 240 can be formed in the openings using a blanket deposition.

In various embodiments, a silicide layer 245 can be formed on the walls of the opening (e.g., via) and at the interface of the source/drain contacts 240 with the top source/drains 230. The silicide layer can be formed by a conformal deposition.

In one or more embodiments, the first bottom source/drain layer 140 can be a p-type bottom source/drain, and second bottom source/drain layer 160 can be an n-type bottom source/drain, where the vertical fins 111 on the first bottom source/drain layer 140 and second bottom source/drain layer 160 having the p-n junctions 165 can form a complementary pair of VT FinFETs of a NAND circuit. The vertical fins 111 on the first bottom source/drain layer 140 separated from the second bottom source/drain layer 160 by the isolation region 170 can form a second complimentary pair of VT FinFETs. Two adjacent vertical fins 111 can be on the same first bottom source/drain layer 140, so they are electrically coupled, and their top source/drains 230 can be electrically coupled.

A first input can be electrically connected to the gate structure on the vertical fins 111 on the first bottom source/drain layer 140 and second bottom source/drain layer 160 having the p-n junctions 165. A second input can be electrically connected to the gate structure on the vertical fins 111 on the first bottom source/drain layer 140 and second bottom source/drain layer 160 separated by the isolation region 170. A first voltage input can be electrically connected to the top source/drains 230 of the p-type VT FinFETs, and a second voltage input can be electrically connected to the top source/drains 230 of the n-type VT FinFETs to form the NAND circuit.

In one or more embodiments, the n-type source/drains, p-type source/drains, and electrical connections can be swapped to form a NOR circuit.

In one or more embodiments, the vertical fins 111 on the first bottom source/drain layer 140 and second bottom source/drain layer 160 having the p-n junctions 165 can form a CMOS inverter circuit.

In various embodiments, the NAND circuits and inverter circuits can be combined to form a multiplexor circuit. The NOR circuits or NAND circuits can be combined to form a FLIP-FLOP circuit.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a fin field effect transistor circuit, comprising:
   forming a plurality of vertical fins on a substrate;
   forming a protective liner having a varying thickness on the substrate and plurality of vertical fins;
   removing thinner portions of the protective liner from the substrate to form protective liner segments on the plurality of vertical fins and between at least one adjacent pair of the plurality of vertical fins;
   removing portions of the substrate exposed by removing the thinner portions of the protective liner to form trenches adjacent to at least one pair of vertical fins and two substrate mesas;
   laterally etching the substrate mesa to widen the trench, reduce the width of the substrate mesa to form a supporting pillar, and undercut the at least one pair of vertical fins; and
   forming a first bottom source/drain layer in the widened trench.

2. The method of claim 1, further comprising removing the first bottom source/drain layer from a widened trench, and forming a second bottom source/drain layer in the widened trench.

3. The method of claim 2, wherein the first bottom source/drain layer includes a first dopant type, and the second bottom source/drain layer includes a second dopant type opposite the first dopant type.

4. The method of claim 3 further comprising heat treating the first bottom source/drain layer and second bottom source/drain layer to diffuse the first dopant type and the second dopant type into the supporting pillar to form an n-p junction.

5. The method of claim 4, further comprising removing the protective liner segments from the plurality of vertical fins and from between the at least one adjacent pair of the plurality of vertical fins.

6. The method of claim 5, further comprising forming a first gate structure on the plurality of vertical fins.

7. The method of claim 6, further comprising forming top source/drains on the plurality of vertical fins.

8. The method of claim 7, further comprising heat treating the top source/drains, first bottom source/drain layer, and second bottom source/drain layer, to form extension regions in the plurality of vertical fins.

9. The method of claim 8, further comprising forming a bottom spacer layer between the first bottom source/drain layer and second bottom source/drain layer and the gate structure.

\* \* \* \* \*